(12) United States Patent
Moghaddam et al.

(10) Patent No.: US 8,073,523 B2
(45) Date of Patent: Dec. 6, 2011

(54) METHOD FOR OBTAINING STRAIN FROM RADIALLY-TAGGED MAGNETIC RESONANCE IMAGING (MRI)

(75) Inventors: Abbas Nasiraei Moghaddam, Pasadena, CA (US); Morteza Gharib, San Marino, CA (US)

(73) Assignee: California Institute of Technology, Pasadena, CA (US)

( * ) Notice: Subject to any disclaimer, the term of this patent is extended or adjusted under 35 U.S.C. 154(b) by 1217 days.

(21) Appl. No.: 11/810,806

(22) Filed: Jun. 6, 2007

(65) Prior Publication Data

US 2008/0009704 A1 Jan. 10, 2008

Related U.S. Application Data

(60) Provisional application No. 60/811,278, filed on Jun. 6, 2006.

(51) Int. Cl.
*A61B 5/055* (2006.01)
(52) U.S. Cl. ........................................ 600/410; 324/309
(58) Field of Classification Search .................. 600/410; 324/309
See application file for complete search history.

(56) References Cited

U.S. PATENT DOCUMENTS 6,892,089 B1    5/2005  Prince et al.
2001/0031037 A1* 10/2001 Prince et al. .................. 378/137

OTHER PUBLICATIONS

Nicholas J. Tustison and Amir A. Amini, "Biventricular Myocardial Strains via Nonrigid Registration of AnFigatomical . . . ", IEEE Trans on Med Imaging, 25: No. 1, 94:112 (2006).
Nael F. Osman, Smita Sampath, Ergin Atalar, and Jerry L. Prince, "Imaging Longitudinal Cardiac Strain on Short-Axis Images Using Strain-Encoded MRI", MRM, 46:324-334 (2001).

* cited by examiner

*Primary Examiner* — Brian Casler
*Assistant Examiner* — Jonathan Cwern
(74) *Attorney, Agent, or Firm* — Tope-McKay & Associates (57) ABSTRACT

The present invention relates to a system for obtaining strain corresponding to an object's deformation by radially-tagged magnetic resonance imaging (MRI). The system acquires at least a ring-shaped crown region of Fourier domain (k-space) data for at least two sequential images of a radially-tagged object at different phases of deformation of the radially-tagged object. A first image represents a primary state of the radially-tagged object and a second image represents a secondary state of the radially-tagged object. Additionally, the images include radial tag lines. The first and second images are reconstructed as a reconstructed primary-state image and a reconstructed secondary-state image. The images are reconstructed as weighted by circumferential density of the radial tag lines, such that they are "tag line density-weighted" reconstructed images. Circumferential strain of the radially-tagged object is determined by comparing the two images.

20 Claims, 9 Drawing Sheets

FIG. 7

METHOD FOR OBTAINING STRAIN FROM RADIALLY-TAGGED MAGNETIC RESONANCE IMAGING (MRI)

PRIORITY CLAIM

The present application is a non-provisional patent application, claiming the benefit of priority of U.S. Provisional Patent Application No. 60/811,278, filed Jun. 6, 2006, titled, "A Fast Method for Obtaining Circumferential Strain from Radially Tagged Short Axis MRI (CIRcumferential COMpression Encoding=CIRCOME)."

BACKGROUND OF THE INVENTION (1) Technical Field

The present invention relates to a method for measuring strain and, more particularly, to a method for measuring circumferential strain from radially-tagged, short-axis magnetic resonance imaging (MRI) of an object.

(2) Background

As the heart beats, the heart's wall contracts longitudinally and rotates laterally. During a heart contraction, the cardiac muscle along the short-axis (SA) of the heart thickens in response to the longitudinal and lateral contraction of the heart. Infracted myocardium reduces the effectiveness of the heart contraction and may be detected by calculating circumferential strain.

Circumferential strain is a quantitative value used to describe the regional and global amplitude of a myocardial contraction and is an important parameter in the quantitative evaluation of heart failure. Clinically, this quantitative evaluation may be used to describe the strength of a heart contraction.

Several methods currently exist for calculating the circumferential strain in the heart. Tagging the SA slices in the radial direction by appropriate modulation of the longitudinal magnetization produces information that can be used to calculate circumferential strain.

Although methods vary, in general, most calculations of this strain are accomplished by using a particle tracking method. Strain calculation therefore comprises particle tracking to obtain the displacement field of the beating heart, followed by spatial differentiation of the obtained displacement field, which is a very noise sensitive process. Therefore, calculation of strain usually requires a time consuming and inaccurate image processing.

One method of determining through plane strain is Strain ENCoding (SNEC) Magnetic Resonance Imaging (MRI). SNEC MRI calculates the through plane strain for an imaging plane. SNEC MRI is unable to encode the in-plane strains including circumferential strain.

Therefore, what is needed is a method for encoding the circumferential compression of the heart in a robust way, without taking spatial derivatives and with the ability to measure strain along several SA planes simultaneously and in real-time. There also exists a need for a method for measuring the regional circumferential strain in the SA planes with minimal calculations for tissue tracking. Finally, a need also exists for a method for calculating circumferential strain that may be combined with a different kind of different MRI pulse sequences.

SUMMARY OF THE INVENTION

The present invention provides a method for calculating strain, such as circumferential strain. More specifically, the present invention teaches a method for obtaining strain corresponding to an object's deformation by tagged magnetic resonance imaging (MRI) in a radial direction in which a substantially normal strain element is found in a direction substantially perpendicular to the radial direction for tagging. The method includes an act of acquiring data of at least one ring-shaped crown region in a spatial frequency domain of an object at a primary state and at least one deformed secondary state. The spatial frequency domain is k-space. The method also includes an act of reconstructing one primary-state image of the primary state and one secondary-state image for each deformed secondary state. The primary-state image and each secondary-state image are filtered and regionally weighted by a radial tag line density of the object. Additionally, the invention includes an act of determining the strain in the object in the direction substantially perpendicular to the radial direction for tagging by comparing the primary-state image with secondary-state image.

In another aspect, a regional strain is determined for a local region by determining an alteration in intensity of the primary-state image and secondary-state image.

In yet another aspect, a tissue tracking algorithm is used to find corresponding regions between the primary-state image and the secondary-state image.

Additionally, the strain is determined by a relative shift of an intensity between the primary-state image and the secondary-state image in the corresponding regions between the primary-state image and the secondary-state image.

In yet another aspect, a global strain is determined for an object by comparing an average intensity of the primary-state image to the average intensity of a secondary-state image. The average intensity is determined by averaging an entire tagged volume in each of the primary-state and secondary-state images.

In another aspect, when determining global strain, the strain is calculated for a three-dimensional (3D) volume.

Furthermore, in the act of acquiring data, the crown region is defined by a lower bound $k_{min}$ and an upper bound $k_{max}$ which surrounds the center of the k-space and corresponds to an absolute value of spatial frequency k between $k_{min}$ and $k_{max}$. Additionally, the data is k-space data. In the act of reconstructing the primary-state image and the secondary-state image, the images are reconstructed through filtering of the k-space data between $k_{min}$ and $k_{max}$ and their Inverse Fast Fourier Transforms (IFFT).

In another aspect, in the act of acquiring data, the object is a heart.

In yet another aspect, the present invention further comprises an act of filtering the primary-state image and each secondary-state image using a circular narrow band-pass filter.

Additionally, the strain is calculated in a direction substantially perpendicular to a radial tag of the object. Further, the data is acquired of an object that is radial tagged such that a density of radial tagging is uneven around the object.

In another aspect, the strain is determined regionally for corresponding regions in each of the primary-state and secondary-state images which are determined by a tissue tracking algorithm for the primary-state and secondary-state images.

The present invention also includes a system and computer program product. The system is configured to perform the operations described herein. Alternatively, the computer program product comprises computer-readable instruction means stored on a computer-readable medium that are executable by a computer for causing the computer to perform such operations. The instruction means generally indicates a set of operations to be performed on a computer, and may represent pieces of a whole program or individual, separable, software modules. Non-limiting examples of "instruction means" include computer program code (source or object code) and "hard-coded" electronics (i.e. computer operations coded into a computer chip). The "instruction means" may be stored in the memory of a computer or on a computer-readable medium such as a floppy disk, a CD-ROM, and a flash drive.

BRIEF DESCRIPTION OF THE DRAWINGS

The objects, features and advantages of the present invention will be apparent from the following detailed descriptions of the disclosed aspects of the invention in conjunction with reference to the following drawings, where.

DETAILED DESCRIPTION

The present invention relates to a method for measuring strain and, more particularly, to a method for measuring circumferential strain from radially-tagged, short-axis magnetic resonance imaging (MRI) of an object. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C: Section 108, Paragraph 6. In particular, the use of "step of" or "act of" in the claims herein is not intended to invoke the provisions of 35 U.S.C. 108, Paragraph 6.

Below, specific details of the present invention are provided to give an understanding of the specific aspects. Then, an overview of the principal aspects of the present invention is presented. Finally, a conclusion is provided to briefly summarize the method according to the present invention.

(1) Specific Details of the Invention

The present invention allows for direct measurement of directional strain from multiple two-dimensional (2-D) or three-dimensional (3-D) primary and secondary images. More specifically, the present invention teaches a method for obtaining either local or global strain of an object which undergoes deformation. The method includes the acts of: (1) acquiring data of the desired object through the tagged magnetic resonance imaging (MRI) in the radial direction; (2) reconstructing the image using spatial frequency information and; finally, (3) determining strain. For clarity, each of the above mentioned processes will be described in turn.

(1.1) Acquisition of Data

Figures 1A, 1B:
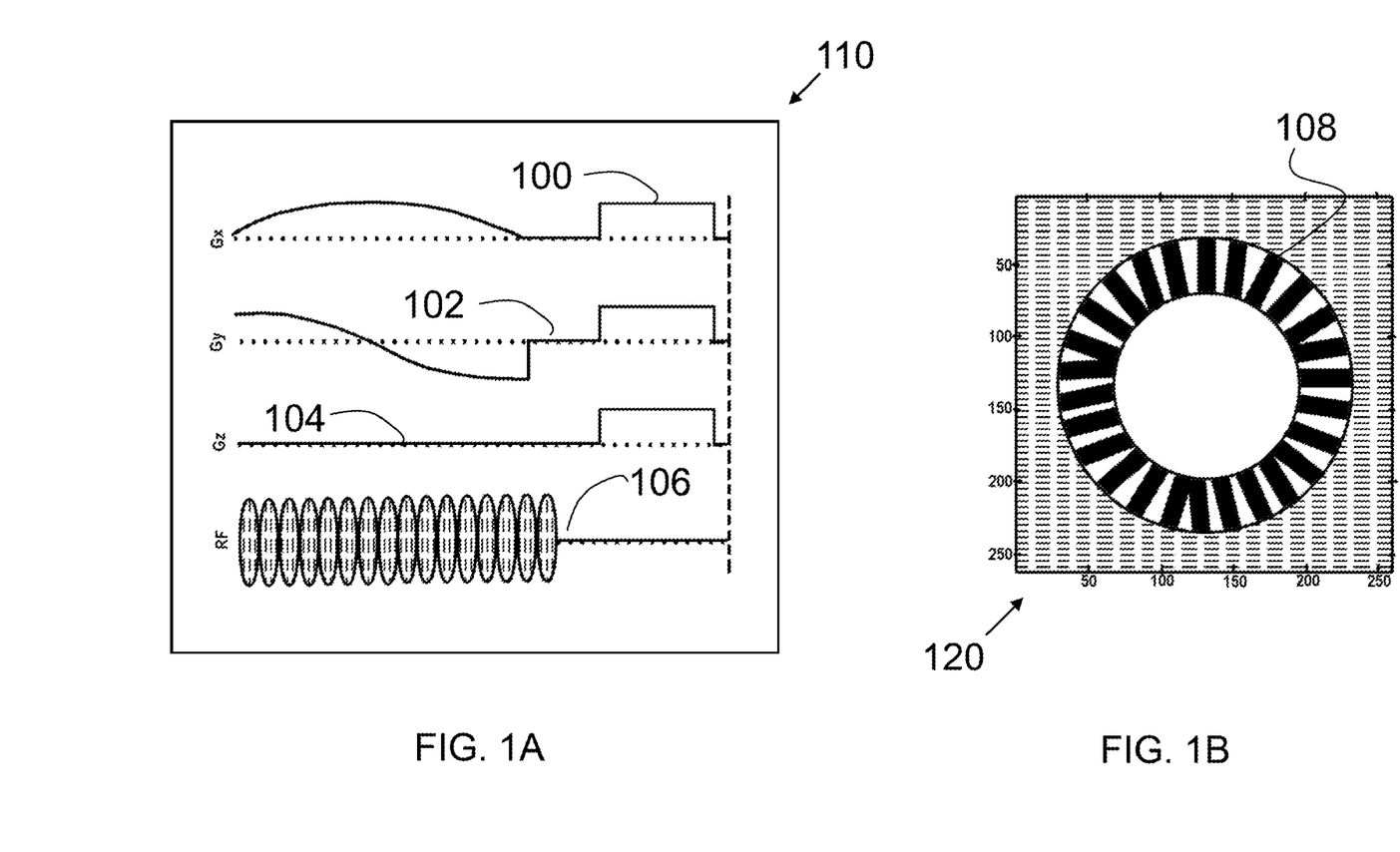
FIG. 1A is a illustration of a preparation pulse sequence and its constituents.
FIG. 1B is a sample image with radial tagging.

The present invention is suitable for determining the directional strain during the deformation of an object. The use of tagged MRI allows a specific region of an object to be targeted in a primary state, and then located in a deformed secondary state of the object. As shown in FIG. 1A, tagging through the use of tag lines is an important tool in the determination of strain in an object of interest which lacks prominent features. In general, tag lines serve as a reference point for relating the translational information of one feature of the object as the object deforms from one state (See FIG. 1C) to another (See FIG. 1D).

Referring to FIG. 1A, the constituents of a typical preparation pulse for tagging are shown. The preparation pulse 110 is comprised of gradient fields $G_X$ 100, $G_Y$ 102, and $G_Z$ 104 followed by a radio frequency signal 106. An example of a tagged MRI image 120 with modulated magnetization is shown in FIG. 1B. Alternating tag lines 108 may also be used to track specific regions of the object in various states of deformation. The radial tag lines in the MRI image 120 are presented as a crown in the spatial frequency domain (k-space), which is used in the reconstruction of the image.

Figure 1C:
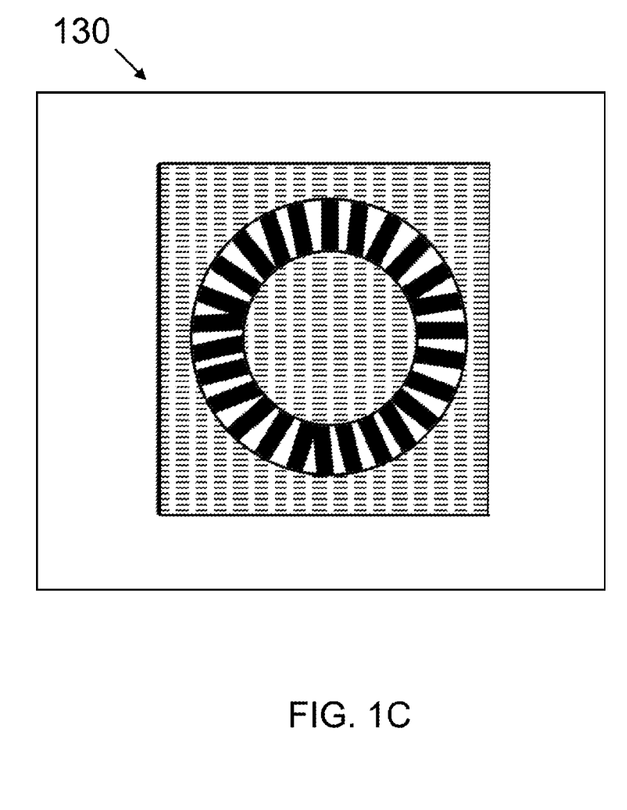
FIG. 1C is an illustration of the primary state of an object with radial tagging.
Figure 1D:
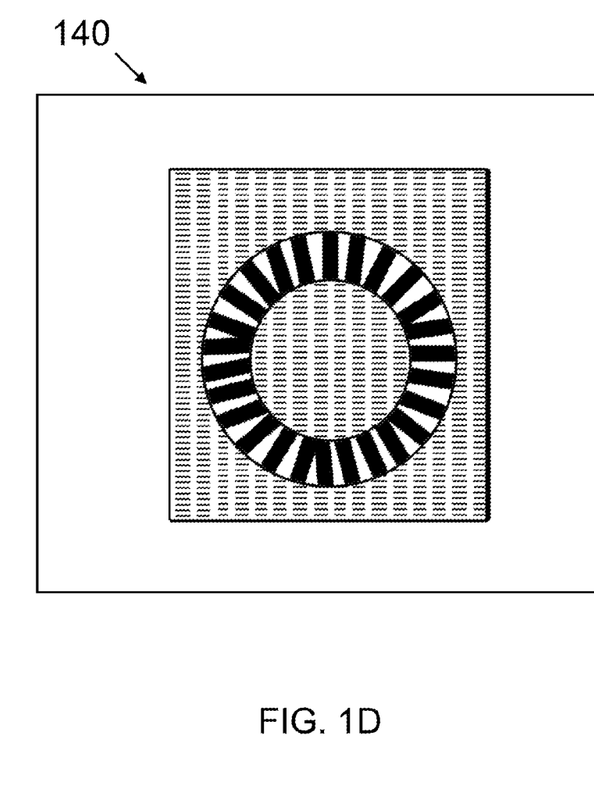
FIG. 1D is an illustration of a deformed secondary state of the object of FIG. 1C with radial tagging.

In general, the object is tagged in the primary state 130 (as shown in FIG. 1C) and remains in a secondary state 140 (as shown in FIG. 1D). Tagging is accomplished by using a preparation pulse or modulated magnetization 110, as shown in FIG. 1A, in the radial direction by appropriate modulation of the longitudinal magnetization $G_X$ 100, $G_Y$ 102, and $G_Z$ 104 followed by a radio frequency signal 106. The radial direction in the image plane is determined with respect to the focal point of the tag lines and does not necessarily have to correlate with the geometrical center of the desired object. The object is tagged using any suitable tagging technique, a non-limiting example of which includes modulated magnetization 110. Further, the object may be radially-tagged such that it is uniformly tagged. Alternatively, in a desirable aspect, the object is radially-tagged such that a density of the radial tagging is uneven around the object.

Additionally, the "strain" is determined in a direction substantially perpendicular to the radial tag lines. Thus the "strain" is not necessarily determined with respect to the geometry of the object, but more specifically with respect to the tag lines. Therefore, both vertical-axis and horizontal-axis images may be used to find the directional strain of the object in the spirit of the present invention. For example, in imaging of the heart, both short-axis and long-axis images can be used with this method to determine the circumferential and semi-longitudinal strains, respectively.

Referring to FIG. 1C and FIG. 1D, the primary state 130 of the tagged object and the deformed secondary state 140 of the same tagged object are shown. The term "primary state" 130 is used to describe an initial state of a subject in either two or three-dimensional space; for example, the relaxed state of a human heart. The purpose of the primary state 130 is to serve as a reference with which regional,or global information of a secondary state 140 may be compared.

Figure 2:
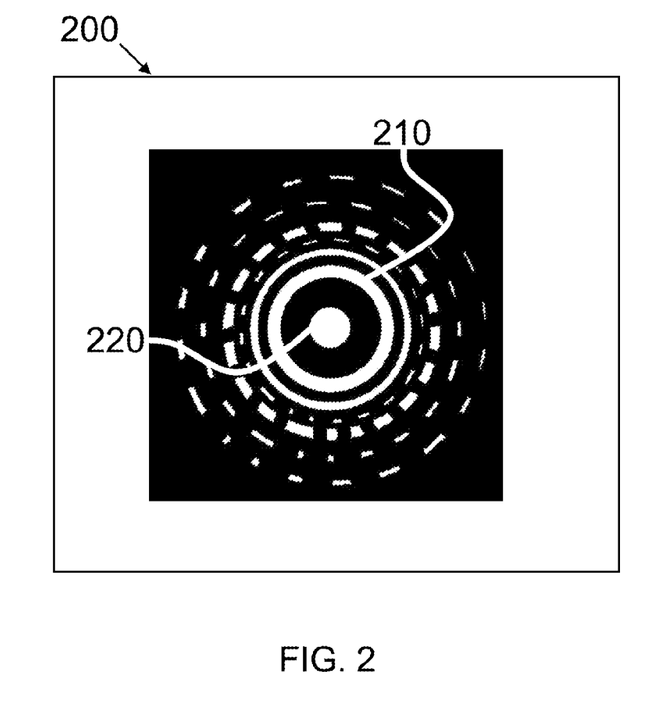
FIG. 2 is a spatial frequency image of a radially-tagged object in k-space.

For a variety of reasons, a plurality of secondary states 140 may be tagged using tag lines and eventually reconstructed (as images, see FIG. 4A and FIG. 4B, respectively) using the spatial frequency data 200 (as shown in FIG. 2) obtained from the tagged MRI (see FIG. 1C and FIG. 1D).

While a variety of methods may be used to collect the spatial frequency data 200, in general, tagged MRI may be carried out in two or three-dimensional space across a large number of planes. As can be appreciated by one skilled in the art, region-to-region comparisons of the tagged object as it undergoes deformation from the primary state 130 (as shown in FIG. 1C) to the deformed secondary state 140 (as shown in FIG. 1D) may be tracked by a variety of tracking algorithms. A non-limiting example of such a tracking algorithm is a point tracking algorithm as described by C. J. Veenman, E. A. Hendriks and M. J. T. Reinders in an article entitled, "A Fast and Robust Point Tracking Algorithm," from the Delft University of Technology, Dept. of Information Technology and Systems, Information & Communication Theory Group.

Referring back to FIG. 2, an illustration is provided that shows the spatial frequency data 200. A variety of methods for collecting the spatial frequency data 200 can be used. Thus, as can be appreciated by one skilled in the art, the present invention is not limited to a particular application for collecting tagged MRI spatial frequency data 200. The acquisition of spatial frequency data 200 may be incorporated as a first act towards the eventual calculation of strain. As an alternative, the acquisition of spatial frequency data 200 may also be conducted separately from the present invention. By providing a method for determining strain that is independent of the data 200 acquisition, the present invention offers a robust method for calculating strain that is readily adaptable to future data acquisition methods.

To acquire the spatial frequency data 200, a number of sampling methods may be used. One such example is spiral data acquisition. Spiral data acquisition can improve the efficiency of the method as it allows the process of data collection to focus on the ring shaped region of the k-space that is required for calculating strain. Instead, spiral data acquisition acquires only the region needed for reconstruction of the spatial frequency image (See FIG. 2). Non-Cartesian reconstruction based on circular trajectory may be combined with spiral data acquisition to increase the speed of the reconstruction process.

The Left Ventricle (LV) of the human heart is one such object from which directional strain information may be determined. In one example, the center of the LV is assumed to be at the magnetic isocenter and the LV long-axis is in the Z-direction. In-plane gradients are a pair of 90 degree out-of-phase sinusoidal pulses which causes the on-resonance plane to rotate around the Z-axis. Magnitude modulation 110 of the RF pulse 106 results in a periodic longitudinal magnetization (such as illustrated in FIG. 1B) for the entire object volume. Gradient spoilers then destroy the transverse magnetization.

Any spatial frequency readout sequence can follow the object preparation. A fast readout makes possible multiphase, multilayer imaging before tag lines fade. Once the spatial frequency information 200 (as shown in FIG. 2) is available, the next act is to apply filtering techniques to reconstruct the primary-state image 400 and deformed secondary-state image(s) 410 (see FIG. 4A and FIG. 4B).

(1.2) Reconstruction

Figure 4A:
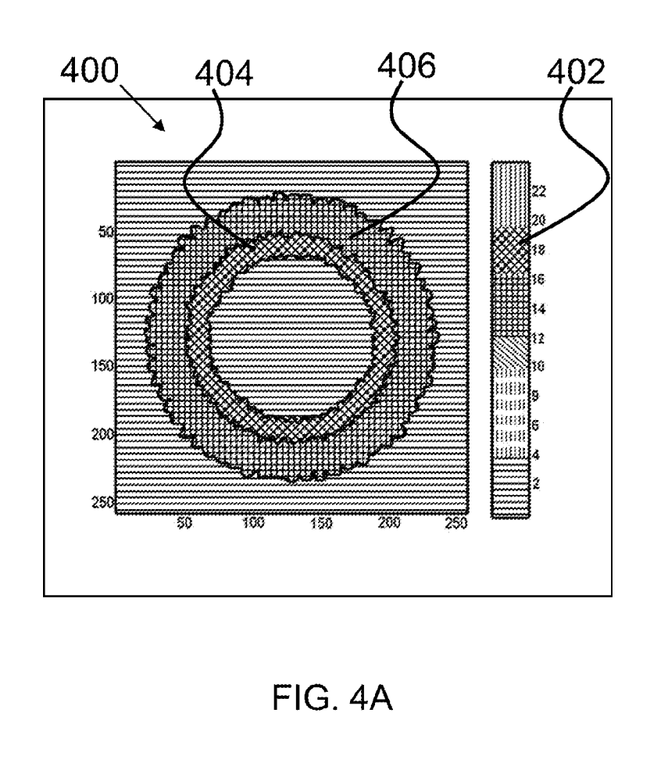
FIG. 4A is an illustration of the primary state of the object of FIG. 1C, which is coded (e.g., color-coded) by the degree of tag line density at each region.
Figure 4B:
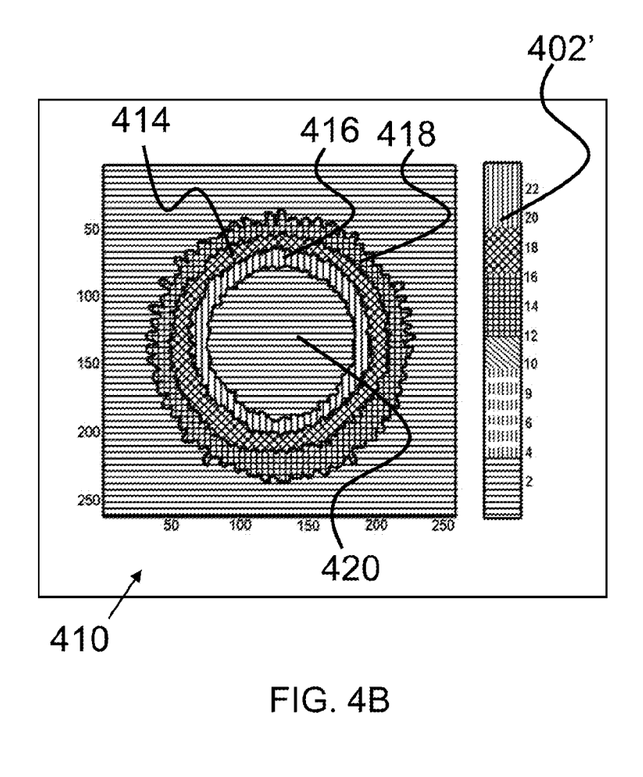
FIG. 4B is an illustration of the deformed secondary state of the object in FIG. 1D, which is coded by the degree of tag line density at each region.

Once the spatial frequency information 200 of the primary state and all of the secondary states have been collected (as shown in FIG. 2), reconstruction of the primary-state image 400 and secondary-state image(s) 410 takes place (as shown in FIGS. 4A and 4B). Referring to FIG. 2, inherent to all spatial frequency data 200 collected using radially-tagged MRI, is a ring-shaped crown 210 region. The "crown" 210 region refers to a circular ridge with a higher relative magnitude of k-values. This highlighted crown 210, which is generated by radial modulation of the preparation signal (see FIG. 1A), surrounds the center of k-space 220 and has a width which corresponds to defined $k_{min}$ and $k_{max}$ values. The crown 210 is not necessarily a continuous region but may comprise two or more disconnected regions.

Information comprising the full crown 210 is distributed in all four quadrants of the spatial frequency image 200. Since the Fast Fourier Transform (FFT) of a real image is symmetrical, only half of the crown 210 is required to extract information. The density of the tag lines 108 (see FIG. 1C and FIG. 1D) which make up the crown 210 may be extracted through appropriate filtering of k-space. The ring-shaped crown 210 is filtered by first determining the relative $k_{min}$ and $k_{max}$ values such that desirable spatial frequency information is obtained and any noise and undesirable data are filtered out. A variety of filtering techniques, such as consecutive narrow band-pass filtering, may be utilized to reconstruct images 400 from the spatial frequency data 200. A non-limiting example of such a band-pass filtering technique is circular band-pass filtering (e.g., a circular narrow band-pass filter).

The present method may be modified to accommodate regions with varying degrees of radial tag line density. For example, regions of tag line density requiring a higher degree of specificity may be reconstructed by using a more selective or thinner circular band-pass filter, in essence, a smaller Δk.

Figure 3A:
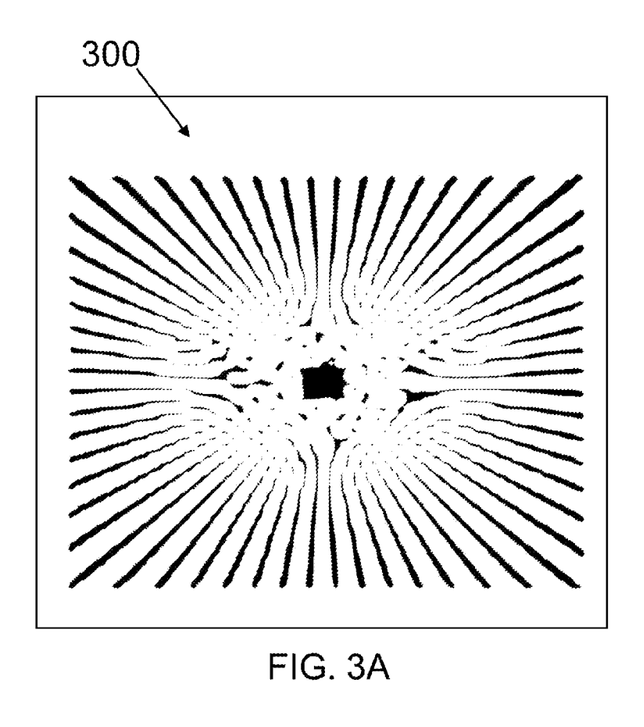
FIG. 3A is a illustration of an object with radial tagging.
Figure 3B:
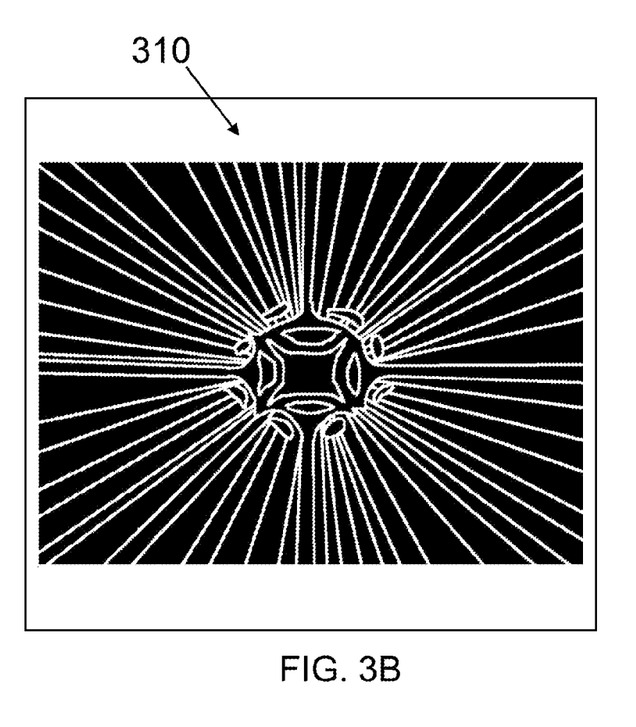
FIG. 3B is a spatial frequency illustration of the object of FIG. 3A after the application of a Fast Fourier Transform (FFT)

Referring to FIG. 3A through FIG. 3D, a sequence showing the transition from a sampled object with radial tagging 300 to the filtered image 330 is depicted. As shown in FIG. 3A, a FFT is applied to the radially-tagged image 300 to uncover the spatial frequency information. The spatial frequency information can be depicted as a spatial frequency image 310, as shown in FIG. 3B.

Figure 3C:
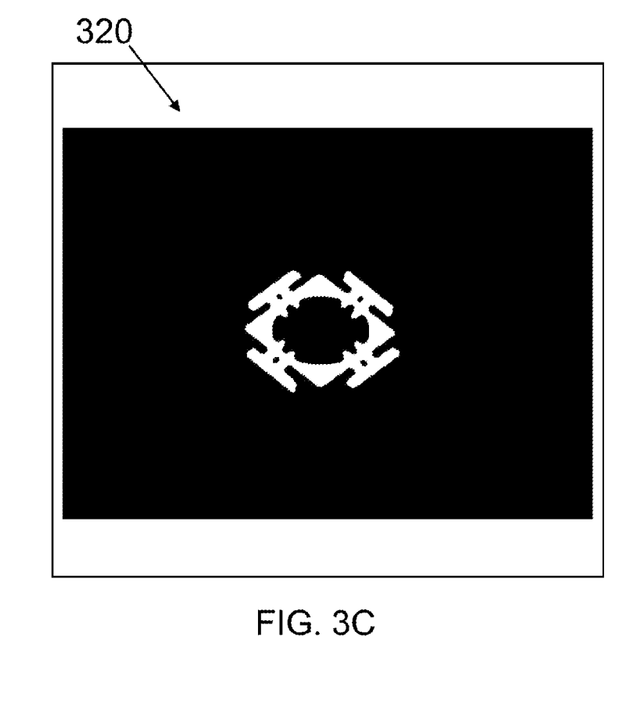
FIG. 3C is a band-pass filtered illustration of the object of FIG. 3B.

A circular narrow band-pass filter is then applied to the spatial frequency image 310, an example of which is shown in FIG. 3A. The filtering begins by selecting an appropriate Δk within the $k_{min}$ and $k_{max}$ values. A circular narrow band-pass filter is then applied to the selected $\Delta k$. Although not required, as shown in FIG. 3C, the k-space filtered data may be depicted as filtered k-space image 320. The circular narrow band-pass filter is repeated a number of times in increments of $\Delta k$ until the entire spectrum of useful information of the crown 200 (shown in FIG. 2) is obtained.

Figure 3D:
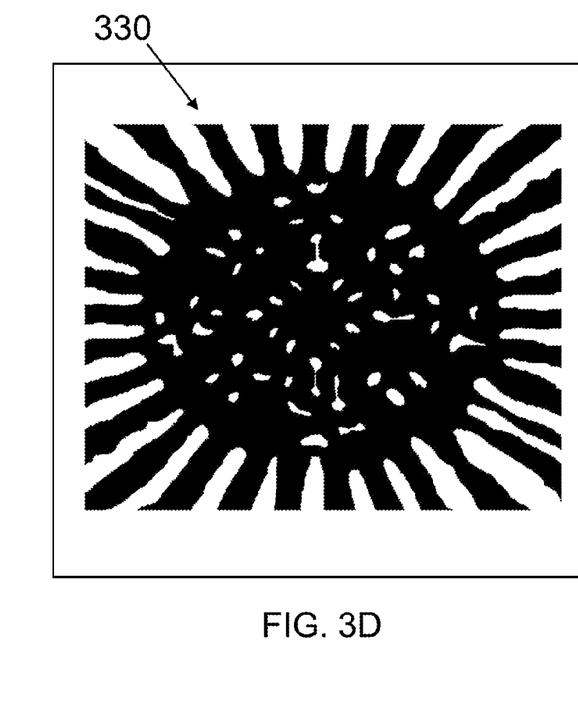
FIG. 3D is the inverse Fourier transform of the filtered illustration of the object of FIG. 3C, which reconstructs part of the object of FIG. 3A with a specific range of tag line densities.

An Inverse Fast Fourier Transform (IFFT) is applied to each set of k-space filtered data, or each optional k-space filtered image 320 to reconstruct part of the imaged object with a specific degree of tag line densities. Superimposition of the reconstructed images which are weighted by the magnitude of k gives an image of the object which is regionally weighted by the density of the tag lines. Referring to FIG. 3D, the aggregate of the circular narrow band-pass filters from $k_{min}$ through $k_{max}$ produces the spatial frequency image 330 of the object. The frequency shift values of the image 330 can then be used to calculate the directional strain between two states of deformation.

Reconstruction of the primary image 400 and secondary image 410 using a coding technique to represent the spatial frequency information is depicted in FIG. 4A and FIG. 4B. The coding technique is any suitable technique for representing variable spatial frequency information, non-limiting examples of which include color coding, grayscale shading, and black and white patterns (as depicted in FIGS. 4A and.4B). Reconstruction of the primary image 400 and secondary image 410 is also accomplished by scanning and filtering k-space with the use of an appropriate filter, and then weighing each recovered region with the magnitude of the corresponding frequency for that particular $\Delta k$.

Referring to FIG. 4A, images produced from the aggregate of circular narrow band-pass filters of the object's primary state are referred to as primary-state images 400. Similarly, those images which correspond to a deformed secondary state are referred to as secondary-state images 410 (see FIG. 4B). As an example, contraction of the higher half of the object with respect to the primary state 400 and the deformed secondary state 410 is illustrated in FIGS. 4A and 4B. Coded spatial frequency keys 402 and 402' relate the spatial frequency data 404, 406, 414, 416, 418, and 420 of a region of the object in various states to a predefined code, such as a particular pattern or color.

A Left Ventricle of a human heart in a relaxed state is depicted in FIG. 4A.

As the heart contracts, the muscle in the heart wall contracts and rotates. The spatial frequency information for this deformed secondary state is depicted in the deformed secondary-state image 410 in FIG. 4B. The contracted heart muscle results in higher relative spatial frequencies in the deformed secondary-state image 410. As an option, tag lines can be utilized in tissue tracking algorithms to relate the local tissue of the primary-state image 400 to the deformed secondary-state image 410. The respective local frequency 406 and 404 of the primary-state image 400 tissue is then compared with the corresponding tissue frequencies 414, 416, and 418 of the deformed secondary-state image 410 in order to determine the directional strain.

(1.3) Determining Strain

As the primary-state image 400 and secondary-state image 410 are tagged by radial lines that meet near the center of the reconstructed images 400 and 410, directional strain, which is proportional to the changes in radial line compression across corresponding regions, may be directly obtained through processing in the k-space domain. Since corresponding regions can be automatically determined by locating the tag information in the primary-state 400 and secondary-state 410 images, the present method greatly reduces the amount of time required to match local regions to their respective before and after locations.

The shift in tag line density from the reconstructed image of the primary state (i.e., primary-state image 400) to the reconstructed image of the secondary state (i.e., secondary-state image 410) is of greatest concern. That is, the numerical value of strain is a function of this shift.

Common examples of strain calculations include global and local strain. Each type of strain may be calculated by comparing the primary-state image 400 and the deformed secondary-state image 410 in a variety of ways. To measure the regional strain in the direction perpendicular to the radial tagging, this comparison involves selecting a local $k_1$ value of a primary-state image 400 and comparing it with the corresponding local $k_2$ value of the deformed secondary-state image 410. One such formula for this comparison may take the form of following simple algebraic equation:

$$\text{Directional Strain} = (k_1 - k_2)/k_2.$$

As another example, regional strain can be determined for a local region by determining an alteration in intensity of the primary-state image 400 and the secondary-state image 410. The word "intensity" refers to any measurable and contrastable feature between the two images. As non-limiting examples, intensity means the gray level of the image or pixel intensity of the reconstructed density-weighted image. In application, the regional strain is determined by a relative shift of the intensity between the primary-state image 400 and the secondary-state image 410 in the corresponding regions between the images.

Global circumferential strain can be easily determined by the average shift of the directional density of tag lines across the entire filtered k-space between the primary-state 400 and secondary-state 410 images. As another example, global strain is determined for an object by comparing an average intensity of the primary-state image 400 to an average intensity of the secondary-state image 410. The average intensity is determined by averaging an entire tagged volume in each of the reconstructed primary-state 400 and secondary-state 410 images.

(2) Principal Aspects

The present invention has three "principal" aspects. As described above, the first is a system for obtaining strain corresponding to an object's motion by tagged magnetic resonance imaging (MRI). The system is typically in the form of a computer system operating software or in the form of a "hard-coded" instruction set. This system may be incorporated into a wide variety of devices that provide different functionalities. The second principal aspect is a method, typically in the form of software, operated using a data processing system (computer). The third principal aspect is a computer program product. The computer program product generally represents computer-readable instructions stored on a computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

Figure 5:
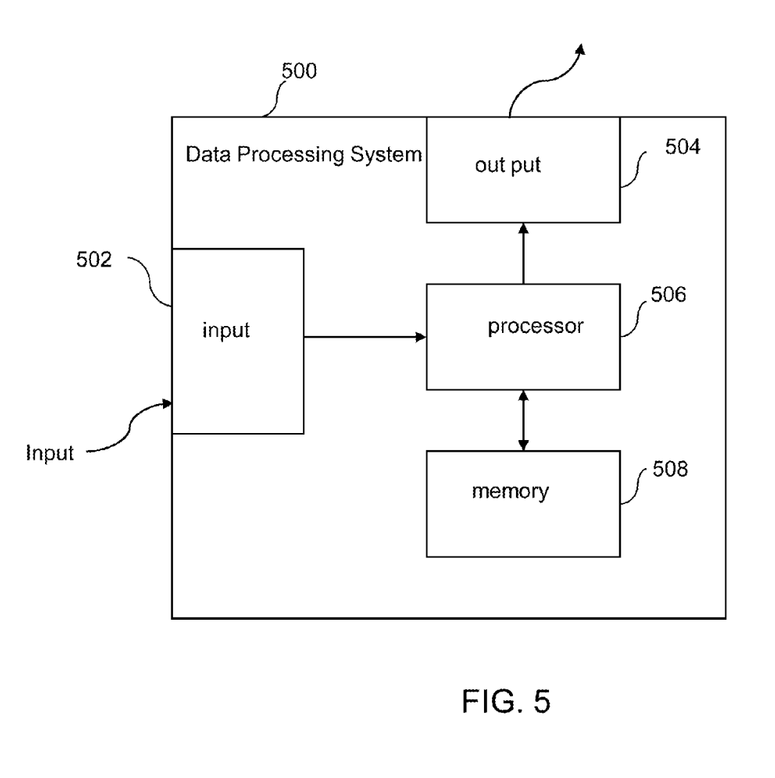
FIG. 5 is a block diagram of a data processing system.

A block diagram depicting the components of a system of the present invention is provided in FIG. 5. The system 500 comprises an input 502 for receiving data regarding the images. Note that the input 502 may include multiple "ports." Typically, input is received from an MRI image. An output 504 is connected with the processor for providing strain information to a user or to other systems in order that a network of computer systems may serve as a system for obtaining strain. Output may also be provided to other devices or other programs; e.g., to other software modules, for use therein. The input 502 and the output 504 are both coupled with a processor 506, which may be a general-purpose computer processor or a specialized processor designed specifically for use with the present invention. The processor 506 is coupled with a memory 508 to permit storage of data and software that are to be manipulated by commands to the processor 506.

Figure 6:
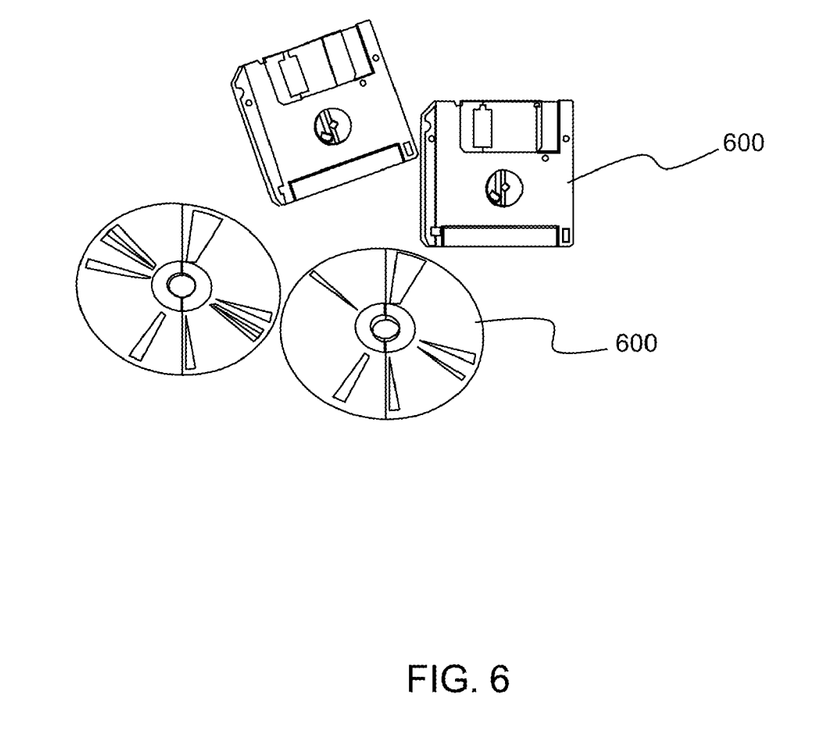
FIG. 6 is an illustration of a diagram of a computer program product embodying the present invention.

An illustrative diagram of a computer program product embodying the present invention is depicted in FIG. 6. The computer program product 600 is depicted as an optical disk such as a CD or DVD. However, as mentioned previously, the computer program product generally represents computer-readable instructions stored on any compatible computer-readable medium.

(3) Conclusion

Figure 7:
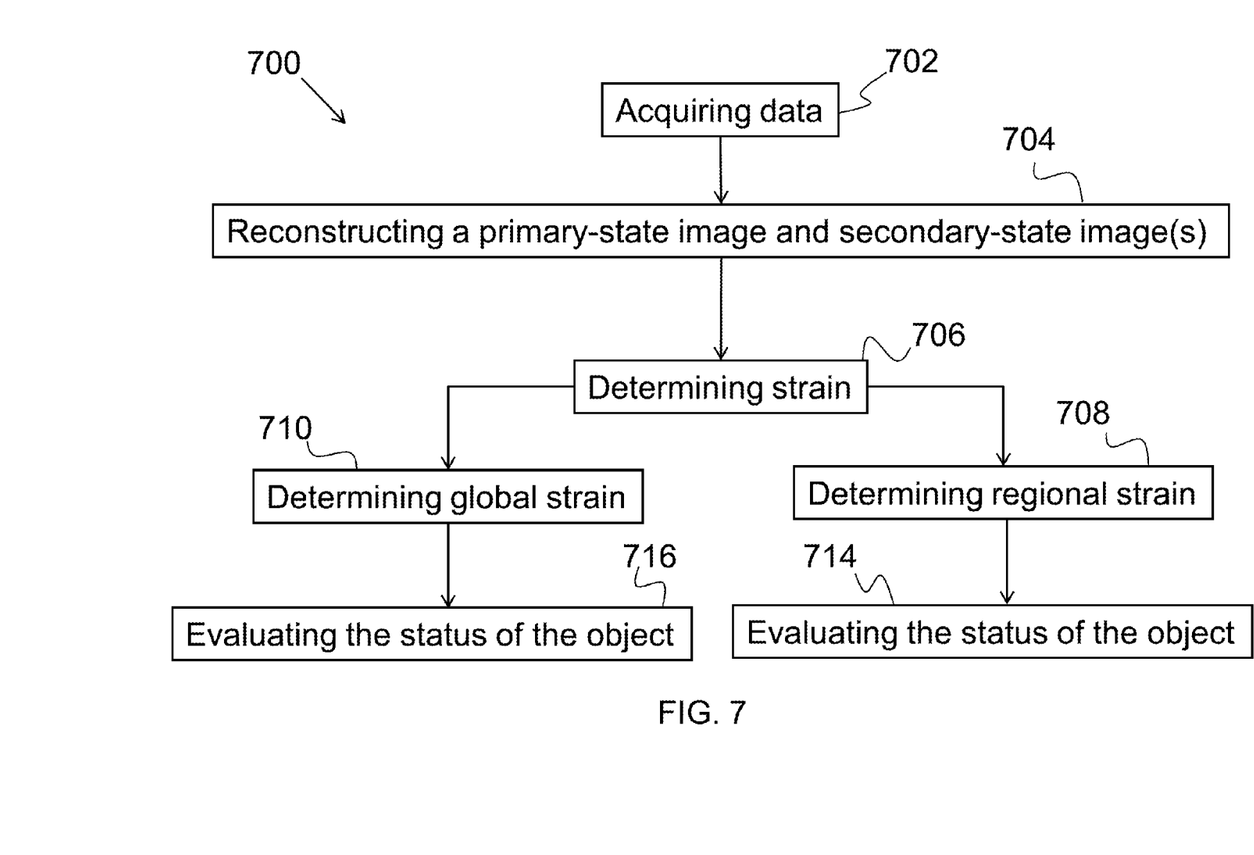
FIG. 7 is a flow chart illustrating a method according to the present invention.

In conclusion, the present invention is a system and method for obtaining strain from radially tagged magnetic resonance imaging (MRI). As illustrated in FIG. 7, the method 700 includes a plurality of acts, including acquiring data 702 with respect to a radially tagged object, reconstructing a primary-state image and secondary-state image(s) 704, and determining strain 706 of the object by comparing the primary-state image with the secondary-state image(s). In determining strain, the strain can be determined as regional strain 708 or a global strain 710. Thus, using the present invention, the strain (either regional or global, depending upon the application) can be used to evaluate the status 714 and 716 of the observed object. For example, the strain can be used to provide a quantitative evaluation of heart (e.g., human heart) failure. Further details with respect to each of these processes are provided above.

What is claimed is:

1. A method for obtaining strain corresponding to an object's deformation by tagged magnetic resonance imaging (MRI) in a radial direction in which a substantially normal strain element is found in a direction substantially perpendicular to the radial direction for tagging, comprising acts of:
   acquiring data of at least one crown region in a spatial frequency domain of an object at a primary state and at least one deformed secondary state;
   reconstructing one primary-state image of the primary state and one secondary-state image for each deformed secondary state, where the primary-state image and each secondary-state image are filtered and regionally weighted by a radial tag line density of the object; and
   determining the strain in the object in the direction substantially perpendicular to the radial direction for tagging by comparing the primary-state image with secondary-state image.

2. A method as set forth in claim 1, wherein in the act of determining strain, a regional strain is determined for a local region by determining an alteration in intensity of the primary-state image and secondary-state image.

3. A method as set forth in claim 2, wherein when determining regional strain, a tracking algorithm is used to find corresponding regions between the primary-state image and the secondary-state image.

4. A method as set forth in claim 3, wherein in the act of determining strain, the strain is determined by a relative shift of an intensity between the primary-state image and the secondary-state image in the corresponding regions between the primary-state image and the secondary-state image.

5. A method as set forth in claim 1, wherein in the act of determining strain, an average intensity is determined by averaging an entire tagged volume in each of the primary-state and secondary-state images.

6. A method as set forth in claim 5, wherein in the act of determining strain, a global strain is determined for an object by comparing the average intensity of the primary-state image to the average intensity of a secondary-state image.

7. A method as set forth in claim 6, wherein when determining global strain, the strain is calculated for a three-dimensional (3D) volume.

8. A method as set forth in claim 1, wherein in the act of acquiring data, the spatial frequency domain is k-space and the crown region is defined by a lower bound $k_{min}$ and an upper bound $k_{max}$ which surrounds the center of the k-space and corresponds to an absolute value of spatial frequency k between and $k_{min}$ and $k_{max}$.

9. A method as set forth in claim 8, wherein in the act of acquiring data, the data is k-space data, and wherein in the act of reconstructing the primary-state image and the secondary-state image, the images are reconstructed through filtering of the k-space data between $k_{min}$ and $k_{max}$ and their Inverse Fast Fourier Transforms (IFFT).

10. A method as set forth in claim 1, wherein in the act of acquiring data, the object is a heart.

11. A method as set forth in claim 1, further comprising an act of filtering the primary-state image and each secondary-state image using a circular narrow band-pass filter.

12. A method as set forth in claim 1, wherein in the act of determining strain, the strain is calculated in a direction substantially perpendicular to a radial tag of the object.

13. A method as set forth in claim 1, wherein in the act of determining strain, the strain is determined regionally for corresponding regions in each of the primary-state and secondary-state images which are determined by a tracking algorithm for the primary-state and secondary-state images.

14. A method as set forth in claim 1, wherein in the act of acquiring data, the data is acquired of an object that is radially-tagged such that a density of radial tagging is uneven around the object.

15. A data processing system for obtaining strain corresponding to an object's deformation by tagged magnetic resonance imaging (MRI) in a radial direction in which a substantially normal strain element is found in a direction substantially perpendicular to the radial direction for tagging, the system comprising a memory and a processor, the memory having executable instructions encoded thereon, such that upon execution by the processor, the processor performs operations of:
   acquiring data of at least one crown region in a spatial frequency domain of an object at a primary state and at least one deformed secondary state;
   reconstructing one primary-state image of the primary state and one secondary-state image for each deformed secondary state, where the primary-state image and each secondary-state image are filtered and regionally weighted by a radial tag line density of the object; and
   determining the strain of the object in the direction substantially perpendicular to the radial direction for tagging by comparing the primary-state image with secondary-state image.

16. A data processing system as set forth in claim 15, wherein when performing an operation of determining strain, a regional strain is determined for a local region by determining an alteration in intensity of the primary-state image and secondary-state image.

17. A data processing system as set forth in claim 15, wherein when performing an operation of determining strain, an average intensity is determined by averaging an entire tagged volume in each of the primary-state and secondary-state images, and wherein a global strain is determined for an object by comparing the average intensity of the primary-state image to the average intensity of a secondary-state image.

18. A computer program product for obtaining strain corresponding to an object's deformation by tagged magnetic resonance imaging (MRI) in a radial direction in which a substantially normal strain element is found in a direction substantially perpendicular to the radial direction for tagging, the computer program product comprising computer-readable instruction means stored on a non-transitory computer-readable medium that are executable by a computer for causing the computer to:

acquire data of at least one crown region in a spatial frequency domain of an object at a primary state and at least one deformed secondary state;

reconstruct one primary-state image of the primary state and one secondary-state image for each deformed secondary state, where the primary-state image and each secondary-state image are filtered and regionally weighted by a radial tag line density of the object; and determine the strain of the object in the direction substantially perpendicular to the radial direction for tagging by comparing the primary-state image with secondary-state image.

19. A computer program product as set forth in claim 18, further comprising instruction means for causing a computer to determine regional strain for a local region of the object by determining an alteration in intensity of the primary-state image and secondary-state image.

20. A computer program product as set forth in claim 18, further comprising instruction means for causing a computer to perform operations of:

determining an average intensity by averaging an entire tagged volume in each of the primary-state and secondary-state images; and determining a global strain for an object by comparing the average intensity of the primary-state image to the average intensity of a secondary-state image.

* * * * *